(12) United States Patent
Hsu (10) Patent No.: US 7,414,824 B2
(45) Date of Patent: Aug. 19, 2008

(54) STORAGE CAPACITOR HAVING A SCATTERING EFFECT AND METHOD OF MANUFACTURING THE SAME

(75) Inventor: Hung-Huei Hsu, Hsin-Chu (TW)

(73) Assignee: Wistron Optronics Corporation, Hsinchu (TW)

( * ) Notice: Subject to any disclaimer, the term of this patent is extended or adjusted under 35 U.S.C. 154(b) by 553 days.

(21) Appl. No.: 10/908,149

(22) Filed: Apr. 28, 2005

(65) Prior Publication Data

US 2005/0181560 A1 Aug. 18, 2005

Related U.S. Application Data

(62) Division of application No. 10/711,018, filed on Aug. 18, 2004, now Pat. No. 6,940,709.

(30) Foreign Application Priority Data

Dec. 26, 2003 (TW) .............................. 92137231 A (51) Int. Cl.
*H01G 4/228* (2006.01)

(52) U.S. Cl. .................... 361/306.2; 361/302; 361/305; 361/306.1; 361/311; 361/313
(58) Field of Classification Search ......... 361/302–305, 361/311–313, 306.2; 257/59, 72
See application file for complete search history.

(56) References Cited

U.S. PATENT DOCUMENTS

| 6,411,347 | B1 * | 6/2002 | Park et al. ...................... 349/39 |
| 6,597,415 | B2 * | 7/2003 | Rho et al. ...................... 349/42 |
| 6,777,709 | B2 * | 8/2004 | Wu et al. ...................... 257/59 |
| 6,800,510 | B2 * | 10/2004 | Peng et al. ................... 438/149 |
| 6,815,715 | B2 * | 11/2004 | Wu et al. ...................... 257/59 |

* cited by examiner

*Primary Examiner*—Nguyen T Ha
(74) *Attorney, Agent, or Firm*—Winston Hsu (57) ABSTRACT

A storage capacitor having a scattering effect is positioned in a substrate for use in a thin film transistor array loop. The storage capacitor is characterized by having a rough layer overlapped by a medium layer and a passivation layer. The storage capacitor further has a reflective layer with high reflectivity so as to provide the storage capacitor with the scattering effect toward an external light source. A method of manufacturing the storage capacitor by two photolithography processes is also shown.

12 Claims, 9 Drawing Sheets

STORAGE CAPACITOR HAVING A SCATTERING EFFECT AND METHOD OF MANUFACTURING THE SAME

CROSS REFERENCE TO RELATED APPLICATIONS

This is a division application of U.S. patent application Ser. No. 10/711,018 entitled "STORAGE CAPACITOR HAVING A SCATTERING EFFECT AND METHOD OF MANUFACTURING THE SAME", filed Aug. 18, 2004 by Hung-Huei Hsu.

BACKGROUND OF INVENTION

1. Field of the Invention

The present invention relates to a liquid crystal display (LCD), and more specifically, to a storage capacitor adapted for use in a thin film transistor array loop and method of making the same.

2. Description of the Prior Art

In recent years, cathode ray tube (CRT) displays have been progressively replaced by liquid crystal displays (LCDs) due to their better characteristics such as high resolution, small size, low driving voltage, and low power-consumption. In the early days, the LCDs adopted transmissive type panel and required a back light module that could provide a planar light source so that the LCDs were visible in the dark or where the light is dim. Later, reflective type panels were developed for reducing the weight and size of LCDs. The reflective type panels utilize the environment light as light sources instead of the back light module.

In conventional technologies, if a scattering effect toward the external light is required, a reflective layer has to be installed in the transmissive type panel so as to form a reflective type panel or a transflective type panel. However, this reflective layer sacrifices the aperture ratio. According to the conventional technologies, several superfluous photolithography processes are required to implement the reflective layer. First, a photolithography process is performed to form teeth-like protrusions on the surface of pixel electrodes, and a flow process is performed to smoothen the protrusions. Then, a high reflective material is deposited onto the surface with protrusions, and at least one photolithography process is performed to form a reflective layer having the scattering effect in a portion of each pixel electrode. It is evident that the conventional method will increase cost and reduce productivity due to several superfluous photolithography processes.

SUMMARY OF INVENTION

It is therefore a primary objective of the present invention to provide a storage capacitor adapted for use in an LCD panel to provide a scattering effect.

It is a second objective of the present invention to provide a method of forming the aforementioned storage capacitor by two lithography processes.

For achieving the foregoing goals, a storage capacitor and method of making the same are disclosed. The storage capacitor is characterized by including a rough layer positioned above an electrode of the storage capacitor. The rough layer includes a medium layer composed of at least a conductive oxide and a passivation layer composed of at least an insulating silicide. The storage capacitor further includes a reflective layer with high reflectivity positioned above the rough layer. The reflective layer can be integrated into the electrode of the storage capacitor, or can be replaced by one electrode of the capacitor that has a high reflectivity. The two electrodes of the storage capacitor are respectively formed by a photolithography process and an etching process. Only in the case that the passivation layer is positioned between the two electrodes and serves as a dielectric layer is the passivation formed without requiring a photolithography process and an etching process. In other cases, the medium layer, the passivation layer, and the reflective layer are formed by the photolithography process and the etching process of adjacent electrode after being deposited.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
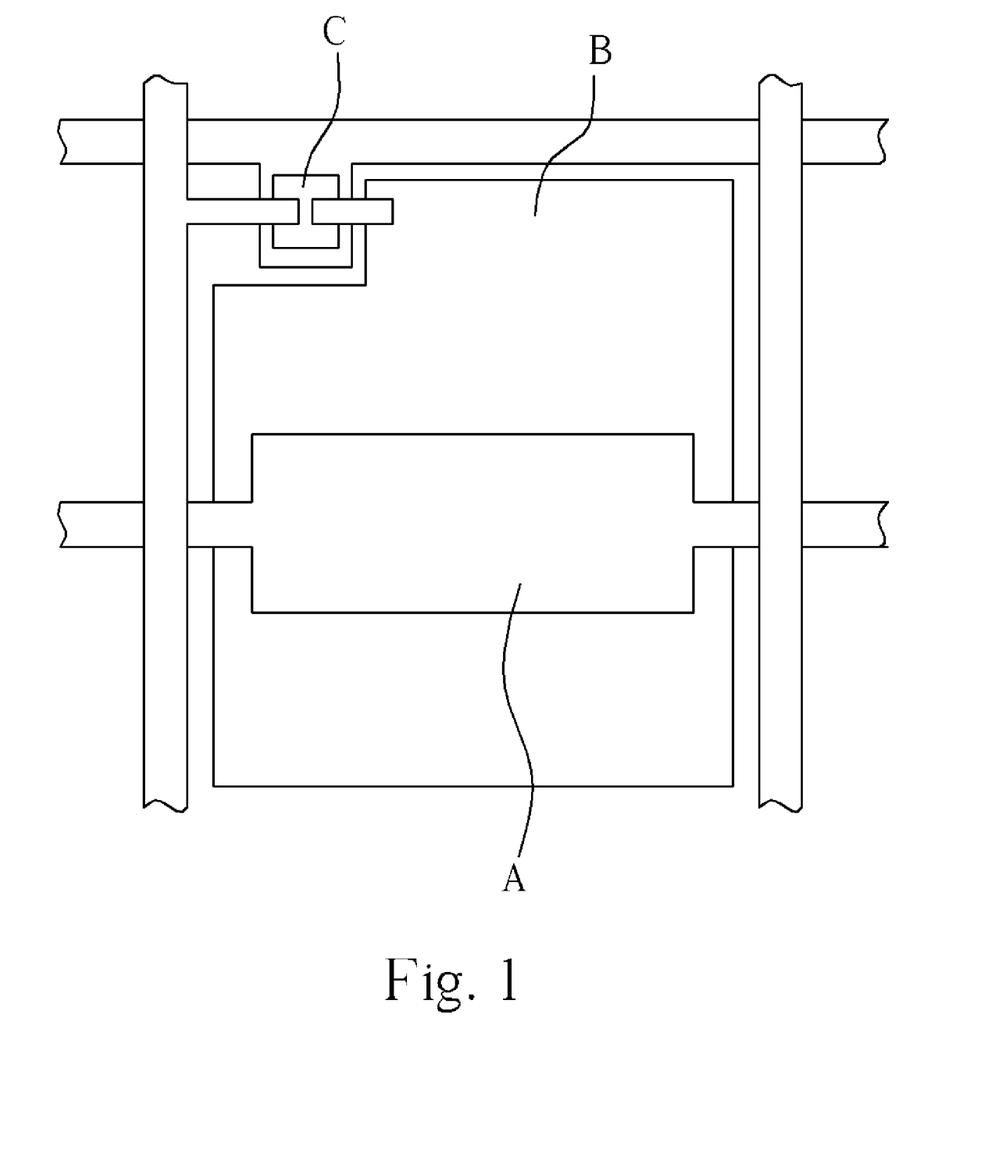
FIG. 1 is a schematic diagram of a TFT loop array of the present invention.

A reflective rough surface in the storage capacitor region provides a transmissive type or a transflective LCD panel with a scattering effect without reducing the aperture ratio. Please refer to FIG. 1. FIG. 1 is a schematic diagram of a TFT array loop of the present invention. As shown in FIG. 1, the TFT array loop includes a storage capacitor region A, a pixel electrode region B, and a TFT region C. A rough layer with high reflectivity is positioned in the storage capacitor region A for providing the scattering effect. In practice, a rough surface is primarily formed in the storage capacitor region A, and then a high reflective material is deposited onto the rough surface so as to provide the scattering effect toward the external light source.

The storage capacitor of a TFT array loop substantially includes a first electrode, a dielectric layer, and a second electrode. The first electrode and the second electrode normally include low resistive conductive materials such as chromium, copper, aluminum, titanium, molybdenum, tantalum, and other alloys. The first electrode and the second electrode can also be composed of light-penetrating conductive materials such as indium oxide, tin oxide, zinc oxide, lead oxide, indium tin oxide, indium zinc oxide, and so on. Each electrode (the first electrode or the second electrode) is formed by first applying vapor deposition technologies to form a single layer conductive structure or a multi-layer conductive structure. Then, a photolithography process and an etching process are consecutively performed to form the electrode (the first electrode or the second electrode). The vapor deposition technologies include physical vapor deposition (PVD) such as evaporation and sputtering, and chemical vapor deposition (CVD) such as atmospheric pressure CVD, low pressure CVD, and plasma enhanced CVD. The photolithography process is implemented by consecutively performing a photo resist coating process, an exposing process, a developing process, and photo resist releasing process. The etching process includes dry etching and wet etching. The dielectric layer generally includes insulating materials such as silicon nitride and silicon oxide, and is formed by CVD.

The present invention implements the aforementioned rough surface by forming a reflective layer composed of a medium layer and a passivation layer, where the medium layer includes indium oxide, tin oxide, zinc oxide, lead oxide, indium tin oxide, indium zinc oxide, and is formed by vapor deposition technologies; the passivation layer includes silicon nitride, silicon oxide, silicon oxynitride, etc., and is formed by CVD. In other words, the overlapped structure of the medium layer and the passivation layer ensure a rough interface between the medium layer and the passivation layer, whether the medium layer or the passivation layer is positioned above the other layer. The overlapped structure has altering patterns with a height ranging from 0.1 to 0.5 µm, and each pattern has a width ranging from 0.3 to 1.5 µm. It is worth noting that when indium tin oxide is used as the material of the medium layer and silicon nitride is used as the material of the passivation layer, the effect of the rough layer is most evident.

The material of the reflective layer with high reflectivity can be selected from metals such as silver and aluminum, or nonmetals such as magnesium oxide and titanium oxide based on different requirements.

For clarifying the characteristics of the present invention, several preferred embodiments with reference figures are illustrated herein.

Figure 2:
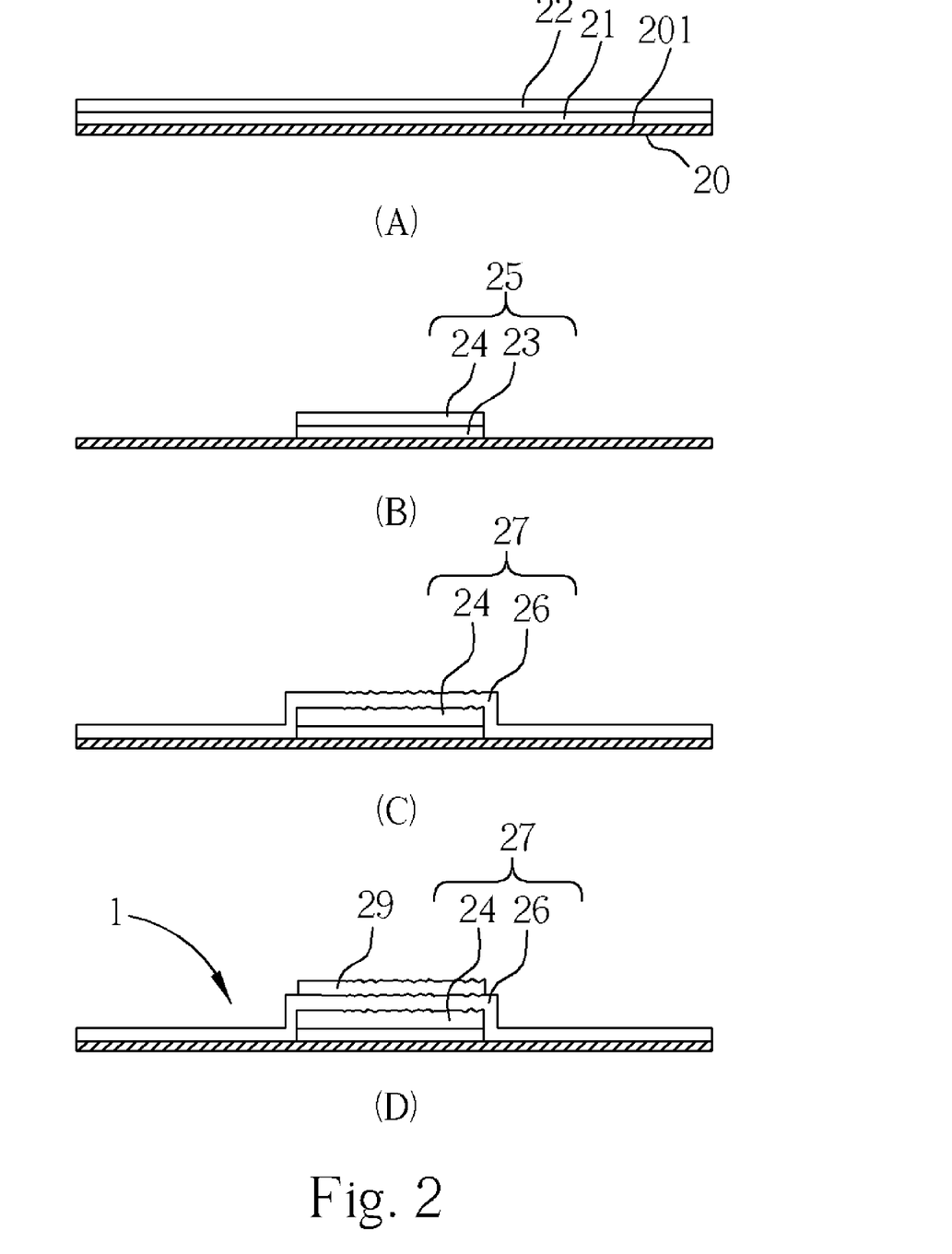
FIG. 2 to FIG. 9 are schematic diagrams illustrating different embodiments of the present invention.

Please refer to FIG. 2. FIG. 2 illustrates a process of forming a storage capacitor 1 having a scattering effect according to the first preferred embodiment of the present invention. As shown in FIG. 2(A), a substrate 20 is provided, and a conductive layer 21 and a medium layer 22 are consecutively deposited onto a surface 201 of the substrate 20. As shown in FIG. 2(B), a photolithography process and an etching process are consecutively performed to form an island-like overlapped structure 25 having a first electrode 23 and an overlapped medium layer 24, where the conductive layer 21 forms the first electrode 23, and the material of the conductive layer 21 is copper. As shown in FIG. 2(C), a passivation layer 26 is then deposited to overlay the overlapped structure 25, where the materials of the overlapped medium 24 and the passivation layer 26 are respectively indium tin oxide and silicon nitride. As long as the passivation layer is overlaid onto the overlapped medium layer 24, a rough layer 27 having a rough surface is formed. As shown in FIG. 2(D), a reflective layer (not shown) is deposited onto the passivation layer 26, and a photolithography process and an etching process are performed to form a second electrode 29 positioned above the first electrode 23. The material of the reflective layer is silver, which is highly reflective and conductive, so as to provide the second electrode 29 with the scattering effect toward the external light source. Accordingly, the first electrode 23, the rough layer 27 composed of the overlapped medium layer 24, the passivation layer 26, and the second electrode 29 overlapped on the substrate 20 from bottom to top form the storage capacitor 1.

Technically, within the range that the reflective layer (not shown) of the second electrode 29 can provide the scattering effect, a plurality of dielectric layers can be added between the passivation layer 26 and the second electrode 29. In addition, both the first electrode 23 and the second electrode 29 can be a multi-layer structure having different conductive materials.

Figure 3:
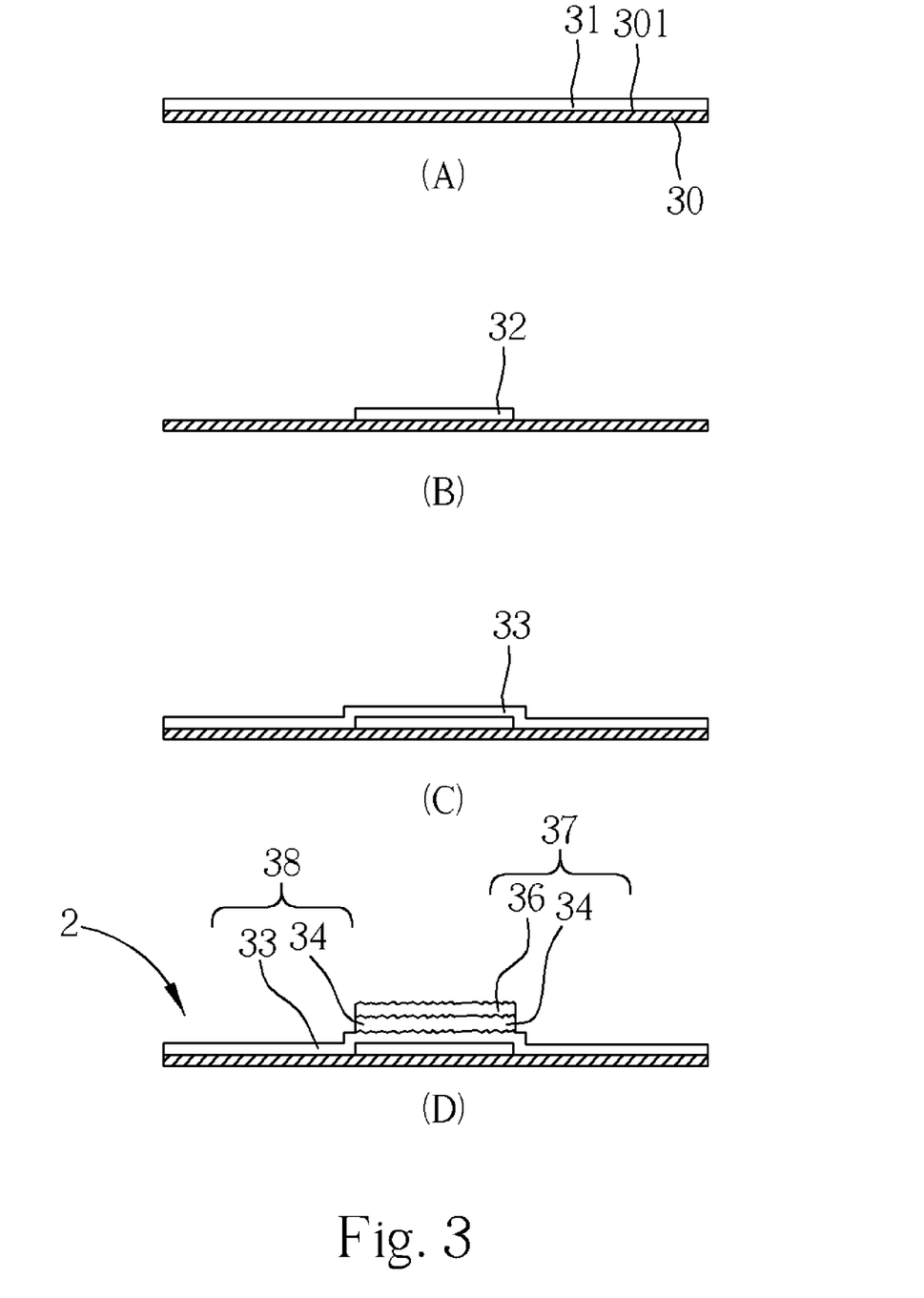

Please refer to FIG. 3. FIG. 3 illustrates a process of forming a storage capacitor 2 having a scattering effect according to the second preferred embodiment of the present invention. As shown in FIG. 3(A), a substrate 30 is provided, and conductive layer 31 is deposited onto a surface 301 of the substrate 30. As shown in FIG. 3(B), a photolithography process and an etching process are consecutively performed to form a first electrode 32, where the material of the conductive layer 31 is titanium. As shown in FIG. 3(C), a passivation layer 33 is deposited to overlay the first electrode 32, where the material of the passivation layer 33 is silicon oxynitride. As shown in FIG. 3(D), a medium layer 34 and a reflective layer (not shown) are consecutively deposited onto the passivation layer 33, and a photolithography process and an etching process are performed to form an island-like overlapped structure 37 including the medium layer 34 and a second electrode 36, where the reflective layer (not shown) forms the second electrode 36, the material of the reflective layer is aluminum, and the material of the medium layer 34 is indium oxide. As long as the medium layer 34 and the passivation layer 33 are overlapped, a rough layer 38 having a rough surface is formed so as to provide the second electrode 36 with the scattering effect. Accordingly, the first electrode 32, the rough layer 38 composed of the passivation layer 33 and the medium layer 34, and the second layer 36 overlapped on the substrate 30 form the storage capacitor 2.

As described in the first embodiment, both the first electrode 32 and the second electrode 36 can be a multi-layer structure having different conductive materials. In addition, if a plurality of dielectric layers are added between the passivation layer 33 and the first electrode 32, the second electrode 36 can still provide the scattering effect toward the external light source.

Figure 4:
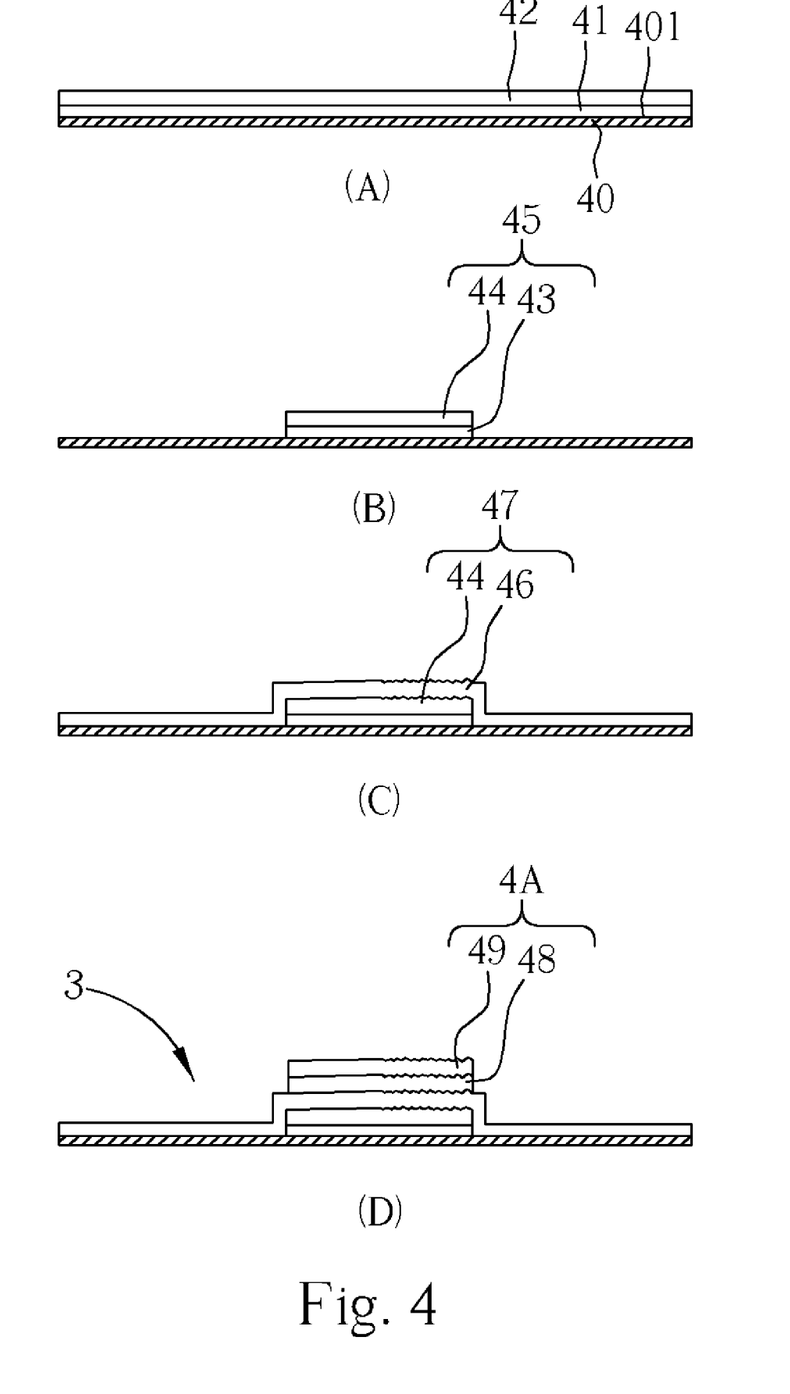

Please refer to FIG. 4. FIG. 4 illustrates a process of forming a storage capacitor 3 having a scattering effect according to the third preferred embodiment of the present invention. As shown in FIG. 4(A), a substrate 40 is provided, and a first conductive layer 41 and a medium layer 42 are deposited onto a surface 401 of the substrate 40. The material of the first conductive layer 41 is chromium, and the material of the medium layer 42 is indium zinc oxide. As shown in FIG. 4(B), a photolithography process and an etching process are consecutively performed to form an overlapped structure 45 including a first electrode 43 and an overlapped medium layer 44, where the first conductive layer 41 forms the first electrode 43. As shown in FIG. 4(C), a passivation layer 46 is deposited to overlay the overlapped structure 45, where the material of the passivation layer 46 is silicon oxide. As long as the passivation layer 46 and the overlapped medium layer 44 are overlapped, a rough layer 47 having a rough surface is formed. As shown in FIG. 4(D), a second conductive layer 48 and a reflective layer 49 are deposited onto the passivation layer 46, and a photolithography process and an etching process are consecutively performed to form a second electrode 4A having an island-like overlapped structure above the first electrode 43. The material of the second conductive layer 48 is chromium, and the material of the reflective layer 49 is magnesium oxide so as to provide the reflective layer 49 with the scattering effect. Accordingly, the first electrode 43, the rough layer 47 composed of the medium layer 41 and the passivation layer 46, and the second electrode 4A overlapped on the substrate 40 from bottom to top form the storage capacitor 3.

As described in the first embodiment, the first electrode 43 and the second electrode 4A can be a multi-layer structure having different conductive materials.

Figure 5:
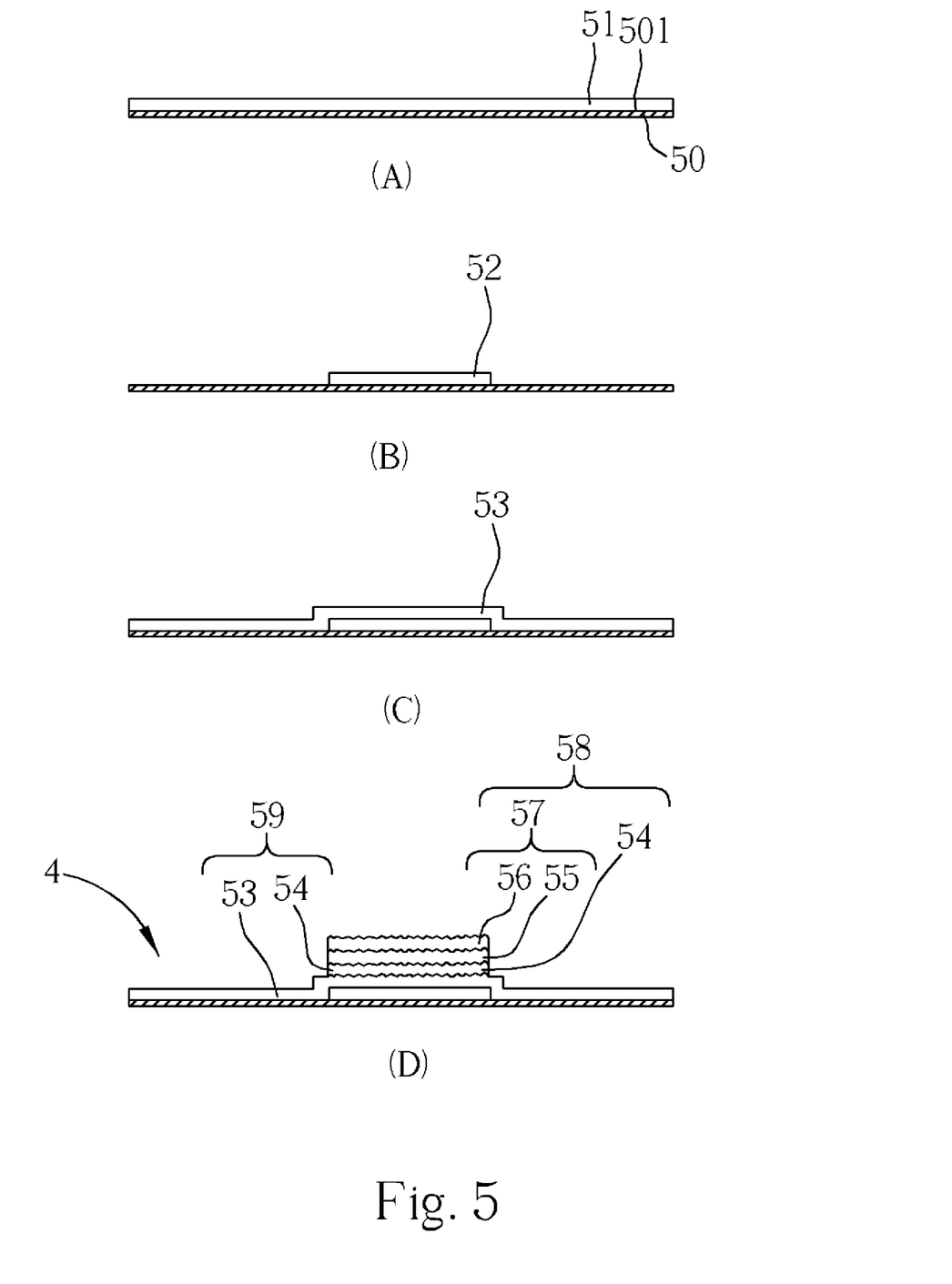

Please refer to FIG. 5. FIG. 5 illustrates a process of forming a storage capacitor 4 having a scattering effect according to the fourth preferred embodiment of the present invention. As shown in FIG. 5(A), a substrate 50 is provided, and a first conductive layer 51 is deposited onto a surface 501 of the substrate 50. As shown in FIG. 5(B), a photolithography process and an etching process are consecutively performed to form a first electrode 52, where the material of the first conductive layer 51 is molybdenum. As shown in FIG. 5(C), a passivation layer 53 is deposited to overlay the first electrode 52, where the material of the passivation layer 53 is silicon nitride. As shown in FIG. 5(D), a medium layer 54, a second conductive layer 55, and a reflective layer 56 are consecutively deposited onto the passivation layer 53, and a photolithography process and an etching process are performed to form an island-like overlapped structure 58 including the medium layer 54 and a second electrode 57. The material of the medium layer 54 is lead oxide, and the material of the second conductive layer 55 is molybdenum. As long as the medium layer 54 the passivation layer 53 are overlapped, a rough layer 59 having a rough surface is formed. In addition, the material of the reflective layer 56 is titanium oxide, which is highly reflective, so as to provide the reflective layer 56 with the scattering effect toward the external light source. Accordingly, the first electrode 52, the rough layer 59 composed of the passivation layer 53 and the medium layer 54, and the second electrode 57 positioned on the substrate 50 from bottom to top form the storage capacitor 4.

Figure 6:
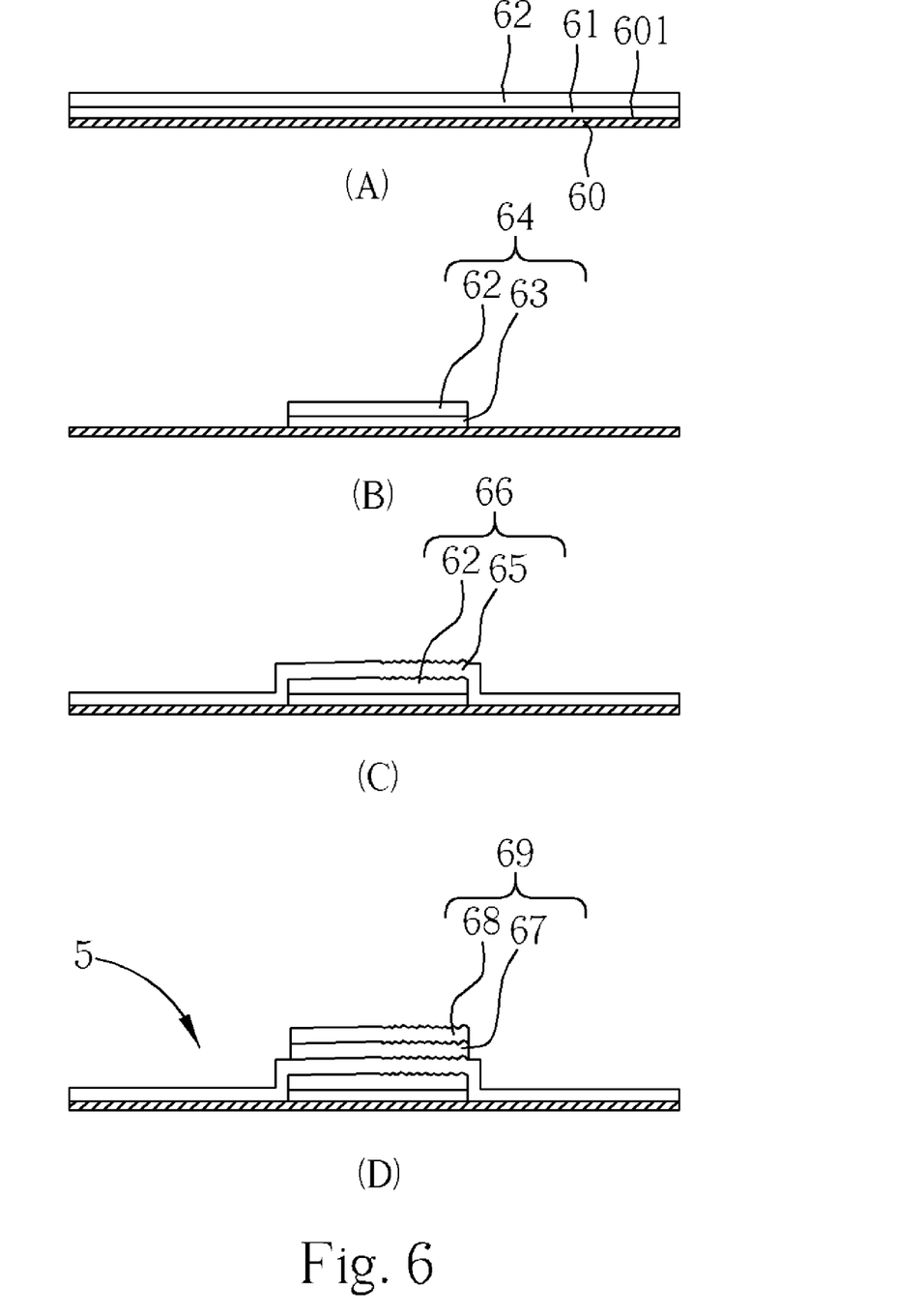

Please refer to FIG. 6. FIG. 6 illustrates a process of forming a storage capacitor 5 having a scattering effect according to the fifth preferred embodiment of the present invention. As shown in FIG. 6(A), a substrate 60 is provided, and a first conductive layer 61 and a medium layer 62 are deposited on a surface 601 of the substrate 60. The material of the first conductive layer 61 is tantalum, and the material of the medium layer 62 is zinc oxide. As shown in FIG. 6(B), a photolithography process and an etching process are performed to form an island-like overlapped structure 64 including the medium layer 62 and a first electrode 63. As shown in FIG. 6(C), a passivation layer 65 is deposited to overlay the overlapped structure 64, where the material of the passivation layer 65 is silicon nitride. As long as the passivation layer 65 and the medium layer 62 are overlapped, a rough layer 66 having a rough surface is formed. As shown in FIG. 6(D), a reflective layer 67 and a second conductive layer 68 are deposited onto the passivation layer 65, and a photolithography process and an etching process are consecutively performed to form a second electrode 69 having an island-like structure above the first electrode 63. The material of the second conductive layer 68 is indium tin oxide, which is light-penetrating, and the material of the reflective layer 67 is titanium oxide, which is highly reflective, so as to provide the reflective layer 67 with the scattering effect toward the external light source. Accordingly, the first electrode 63, the rough layer 66 composed of the medium layer 62 and the passivation layer 65, and the second electrode 69 positioned on the substrate 60 from bottom to top form the storage capacitor 5.

Figure 7:
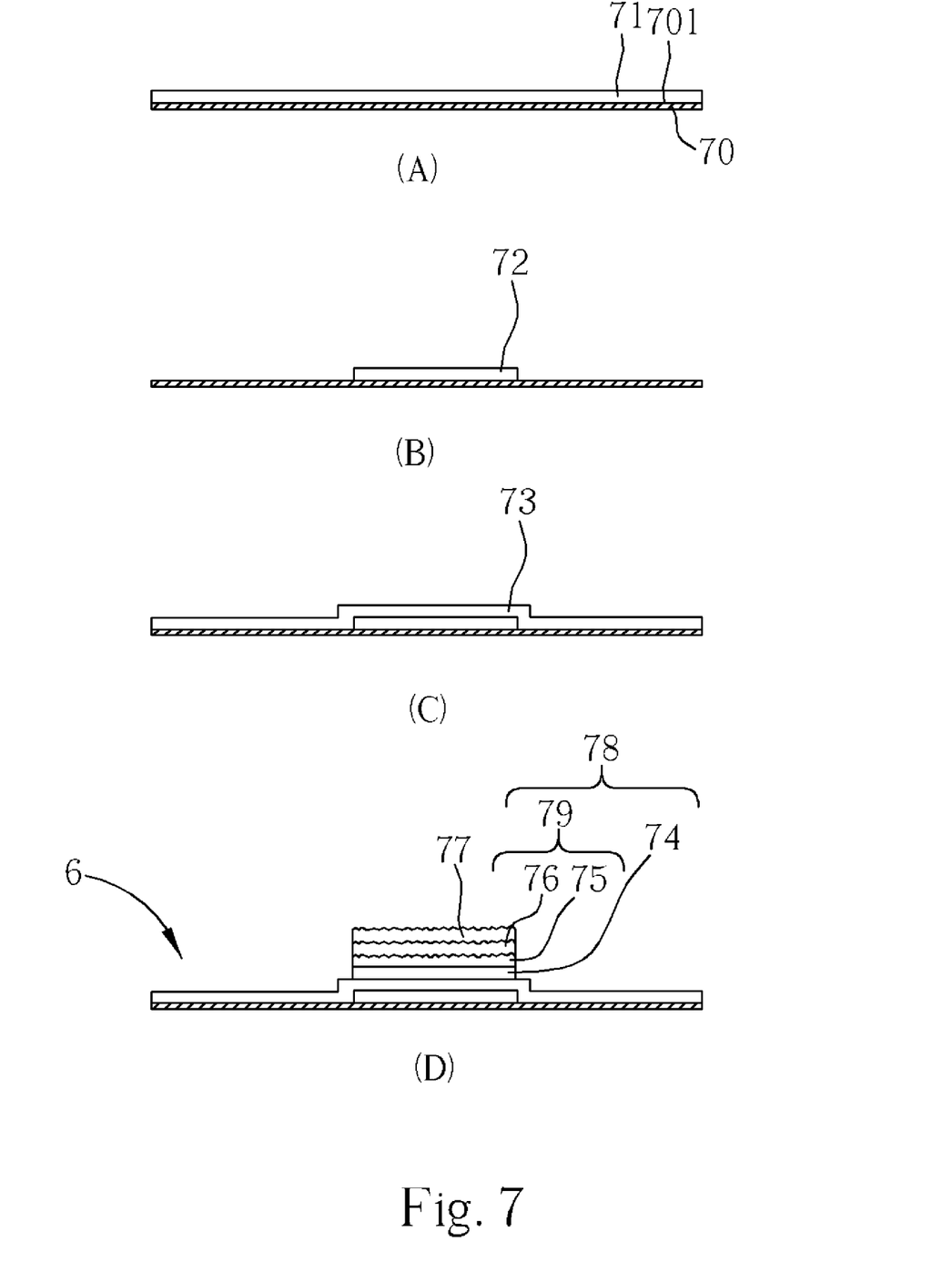

Please refer to FIG. 7. FIG. 7 illustrates a process of forming a storage capacitor 6 having a scattering effect according to the sixth preferred embodiment of the present invention. As shown in FIG. 7(A), a substrate 70 is provided, and a first conductive layer 71 is deposited on a surface 701 of the substrate 70. As shown in FIG. 7(B), a photolithography process and an etching process are performed to form a first electrode 72, where the material of the first conductive layer is chromium. As shown in FIG. 7(C), a dielectric layer 73 is deposited onto the first electrode 72, where the material of the dielectric layer 73 is silicon nitride. As shown in FIG. 7(D), a second conductive layer 74, a medium layer 75, a passivation layer 76, and a reflective layer 77 are consecutively deposited onto the dielectric layer 73. Then, a photolithography process and an etching process are performed to form a second electrode 78 having an island-like structure above the first electrode 72. The material of the second conductive layer is chromium, and the material of the medium layer 75 and the passivation layer 76 are respectively tin oxide and silicon oxide. As long as the passivation layer 76 and the medium layer 75 are overlapped, a rough layer 79 having a rough surface is formed. The material of the reflective layer 77 is magnesium layer so as to provide the scattering effect toward the external light source. Accordingly, the first electrode 72, the dielectric layer 73, and the second electrode 78 positioned on the substrate 70 from bottom to top form the storage capacitor 6.

Figure 8:
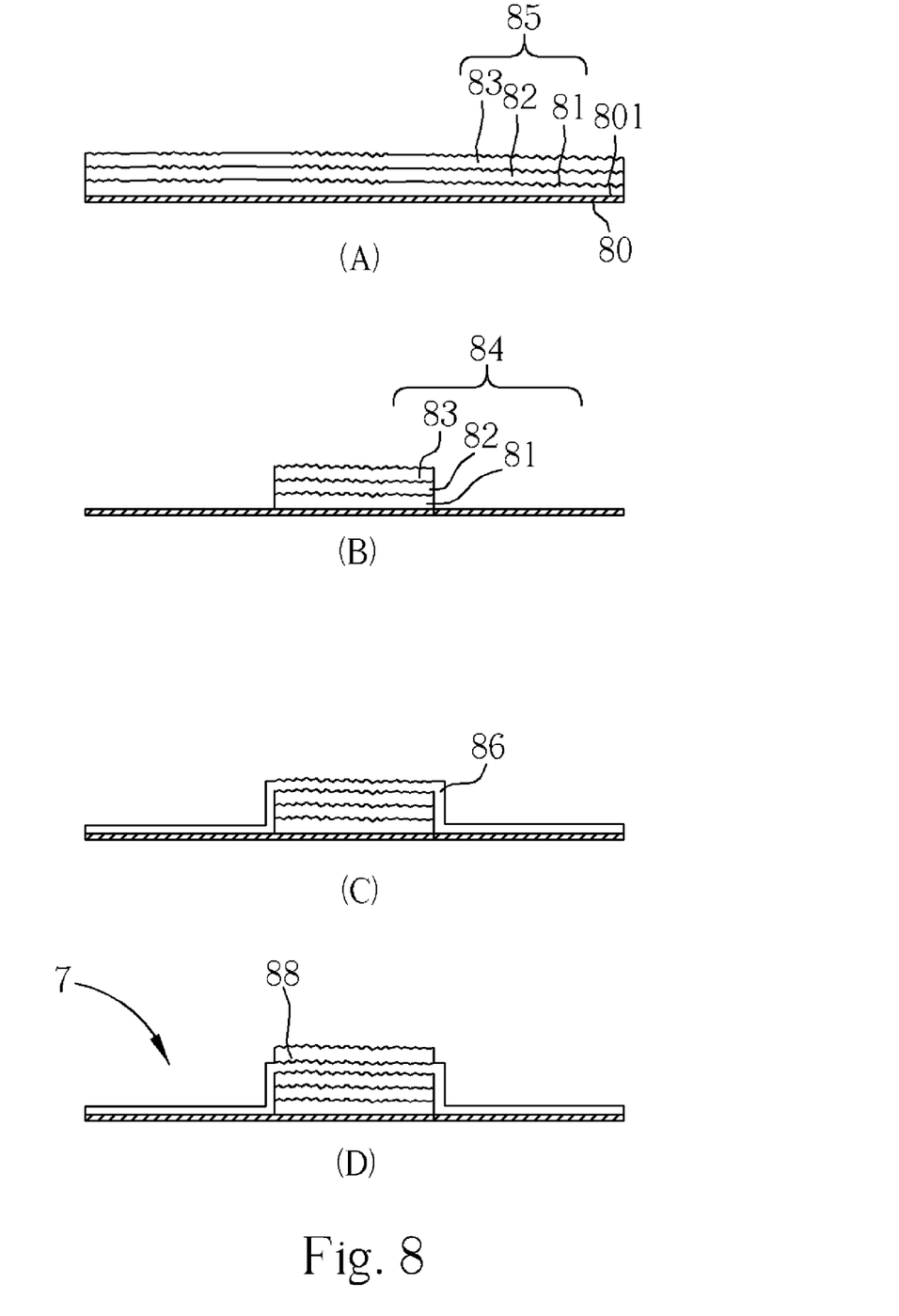

Please refer to FIG. 8. FIG. 8 illustrates a process of forming a storage capacitor 7 having a scattering effect according to the seventh preferred embodiment of the present invention. As shown in FIG. 8(A), a substrate 8 is provided, and a passivation layer 81, a medium layer 82, and a first conductive layer 83 are deposited on a surface 801 of the substrate 80. As shown in FIG. 8(B), a photolithography process and an etching process are performed to form a first electrode 84 having an island-like overlapped structure. The material of the first conductive layer 83 is copper, the material of the passivation layer 81 is silicon nitride, and the material of the medium layer 82 is indium tin oxide. As long as the medium layer 82 and the passivation layer 81 are overlapped, a rough layer 85 having a rough surface is formed. As shown in FIG. 8(C), a dielectric layer 86 is deposited onto the first electrode 84, where the material of the dielectric layer 86 is silicon nitride. As shown in FIG. 8(D), a reflective layer (not shown) is deposited onto the dielectric layer 86, and a photolithography process and an etching process are performed to form a second electrode 88. The material of the reflective layer (not shown) is silver, which is highly reflective and conductive, so as to provide the second electrode 88 with the scattering effect toward the external light source. Accordingly, the first electrode 84, the dielectric layer 86, and the second electrode 88 positioned on the substrate 80 from bottom to top form the storage capacitor 7.

Figure 9:
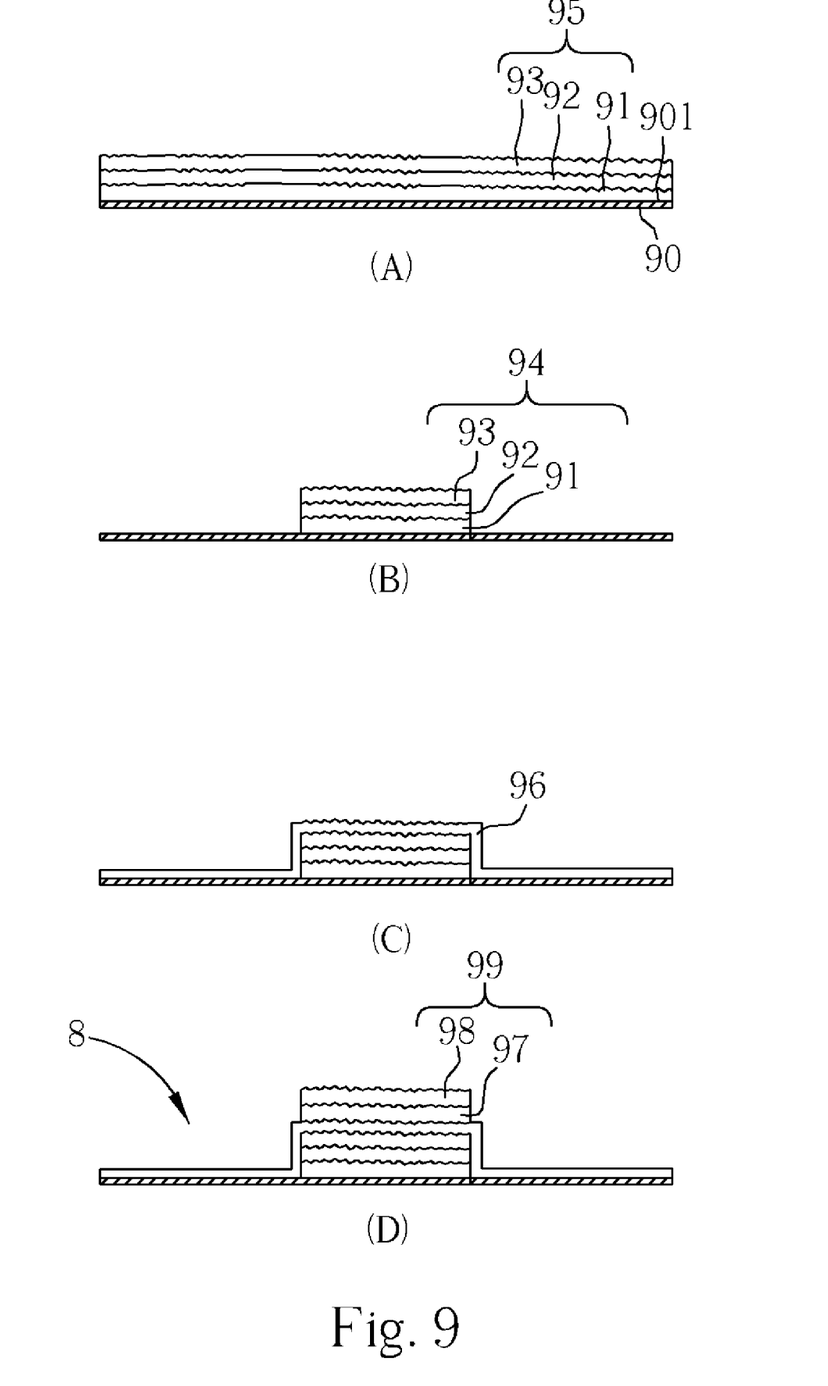

Please refer to FIG. 9. FIG. 9 illustrates a process of forming a storage capacitor 8 having a scattering effect according to the eighth preferred embodiment of the present invention. As shown in FIG. 9(A), a substrate 90 is provided, and a passivation layer 91, a medium layer 92, and a first conductive layer 93 are deposited on a surface 901 of the substrate 90. As shown in FIG. 9(B), a photolithography process and an etching process are performed to form a first electrode 94 having an island-like overlapped structure. The material of the first conductive layer 93 is titanium, and the materials of the passivation layer 91 and the medium layer 92 are respectively silicon oxide and tin oxide. As long as the medium layer 92 and the passivation layer 91 are overlapped, a rough layer 95 having a rough surface is formed. As shown in FIG. 8(C), a dielectric layer 96 is deposited onto the first electrode 94, where the material of the dielectric layer is silicon nitride. As shown in FIG. 8(D), a second conductive layer 97 and a reflective layer 98 are deposited onto the dielectric layer 96, and a photolithography process and an etching process are performed to form a second electrode 99 above the first electrode 94. The material of the second conductive layer 97 is titanium, and the material of the reflective layer 98 is magnesium oxide, which is highly reflective, so as to provide the second electrode 99 with the scattering effect toward the external light source. Accordingly, the first electrode 94, the dielectric layer 96, and the second electrode 99 positioned on the substrate 90 from bottom to top form the storage capacitor 8.

The present invention reforms the storage capacitor to improve the reflectivity efficiency of the LCD panel, and consequently the brightness is increased. In addition, the method of the present invention does not require an extra photolithography process for roughening the surface, thus the cost is reduced and the productivity is improved.

It is remarkable that the storage capacitor of the present invention is positioned in a TFT LCD, which is a three-terminal active matrix LCD. However, the present invention can also be applied in other LCDs, such as a two-terminal thin film diode (TFD) LCD and a metal insulator metal (MIM) LCD.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a storage capacitor having a scattering effect for use in a thin film transistor array loop, the method comprising the following steps:
    forming a first conductive layer and a medium layer on a substrate so as to form an island-like overlapped structure comprising a first electrode, wherein the first conductive layer forms the first electrode;
    depositing a passivation layer to overlay the island-like overlapped structure, wherein the medium layer and the passivation layer form a rough layer; and
    forming a second electrode on the rough layer.

2. The method of claim 1 wherein the second electrode comprises a reflective layer with high reflectivity and conductivity.

3. The method of claim 1 wherein the second electrode is an island-like overlapped structure comprising a second conductive layer and a reflective layer with high reflectivity, and the second conductive layer and the reflective layer are formed consecutively.

4. The method of claim 1 wherein the second electrode is an island-like overlapped structure comprising a reflective layer with high reflectivity and a second conductive layer, the reflective layer and the second conductive layer are formed consecutively, and the second conductive layer is light-penetrating.

5. The method of claim 1 wherein the medium layer is composed of materials selected from a group consisting of indium oxide, tin oxide, zinc oxide, lead oxide, indium tin oxide, and indium zinc oxide.

6. The method of claim 1 wherein the passivation layer is composed of materials selected from a group consisting of silicon nitride, silicon oxide, and silicon oxynitride.

7. A method of forming a storage capacitor having a scattering effect for use in a thin film transistor array loop, the method comprising the following steps:
    forming a first conductive layer on a substrate so as to form a first electrode;
    depositing a passivation layer to overlay the first electrode; and
    forming an island-like overlapped structure comprising a second electrode on the passivation layer, wherein the island-like overlapped structure comprises a medium layer and a reflective layer with high reflectivity formed consecutively, and wherein the passivation layer and the medium layer form a rough layer, and the reflective layer forms the second electrode.

8. The method of claim 7 wherein the medium layer is composed of materials selected from a group consisting of indium oxide, tin oxide, zinc oxide, lead oxide, indium tin oxide, and indium zinc oxide.

9. The method of claim 7 wherein the passivation layer is composed of materials selected from a group consisting of silicon nitride, silicon oxide, and silicon oxynitride.

10. A method of forming a storage capacitor having a scattering effect for use in a thin film transistor array loop, the method comprising the following steps:
    forming a first conductive layer on a substrate so as to form a first electrode;
    depositing a passivation layer to overlay the first electrode; and
    forming an island-like overlapped structure comprising a second electrode on the passivation layer, wherein the island-like overlapped structure comprises a medium layer, a second conductive layer, and a reflective layer with high reflectivity formed consecutively, wherein the passivation layer and the medium layer form a rough layer, and the second conductive layer and the reflective layer form the second electrode.

11. The method of claim 10 wherein the medium layer is composed of materials selected from a group consisting of indium oxide, tin oxide, zinc oxide, lead oxide, indium tin oxide, and indium zinc oxide.

12. The method of claim 10 wherein the passivation layer is composed of materials selected from a group consisting of silicon nitride, silicon oxide, and silicon oxynitride.

* * * * *